(12) United States Patent
Lee et al.

(10) Patent No.: US 11,929,758 B2
(45) Date of Patent: Mar. 12, 2024

(54) SUCCESSIVE APPROXIMATION REGISTER ANALOG-TO-DIGITAL CONVERTER FOR WIDE SAMPLING RATE

(71) Applicant: SEMISOLUTION CO., LTD., Yongin-si (KR)

(72) Inventors: Jung Won Lee, Seoul (KR); Ji Hyung Kim, Yongin-si (KR)

(73) Assignee: SEMISOLUTION CO., LTD., Yongin-si (KR)

( * ) Notice: Subject to any disclaimer, the term of this patent is extended or adjusted under 35 U.S.C. 154(b) by 0 days.

(21) Appl. No.: 17/433,031

(22) PCT Filed: Mar. 19, 2021

(86) PCT No.: PCT/KR2021/003393
§ 371 (c)(1),
(2) Date: Aug. 23, 2021

(87) PCT Pub. No.: WO2022/019434
PCT Pub. Date: Jan. 27, 2022

(65) Prior Publication Data
US 2023/0344439 A1    Oct. 26, 2023

(30) Foreign Application Priority Data
Jul. 21, 2020  (KR) .......................... 10-2020-0090579

(51) Int. Cl.
*H03M 1/38* (2006.01)
*H03M 1/46* (2006.01)

(52) U.S. Cl.
CPC ............... *H03M 1/38* (2013.01); *H03M 1/46* (2013.01)

(58) Field of Classification Search
CPC .................................. H03M 1/38; H03M 1/46
USPC ......................................................... 341/161
See application file for complete search history.

(56) References Cited

U.S. PATENT DOCUMENTS

| | | | |
|---|---|---|---|
| 5,500,612 A | 3/1996 | Sauer | |
| 7,969,343 B2* | 6/2011 | Ishikawa | H03M 1/0604 341/172 |
| 8,035,622 B2* | 10/2011 | Hotelling | G06F 3/0446 345/173 |
| 8,350,738 B2* | 1/2013 | Sanduleanu | H03M 1/1061 341/120 |
| 10,404,927 B2 | 9/2019 | Ha et al. | |

(Continued)

FOREIGN PATENT DOCUMENTS

| | | |
|---|---|---|
| KR | 100366270 | 7/1997 |
| KR | 1020010059338 | 7/2001 |

(Continued)

OTHER PUBLICATIONS

PCT International search report (ISR).

*Primary Examiner* — Jean B Jeanglaude

(57) ABSTRACT

An analog switch circuit in a successive approximation register analog-to-digital converter for a wide sampling rate includes a first PMOS switch controlled by a voltage of a second control node, second PMOS switch controlled by a control voltage, a first control switch unit controlling voltages of first and second control nodes, a first NMOS switch controlled by a voltage of a fourth control node, a second NMOS switch controlled by the control voltage und, and a second control switch unit controlling voltages of third and fourth control nodes.

10 Claims, 8 Drawing Sheets

(56) References Cited

U.S. PATENT DOCUMENTS

2004/0150542 A1    8/2004   Kwon et al.
2013/0009800 A1    1/2013   Yang et al.

FOREIGN PATENT DOCUMENTS

| KR | 100831359 | 7/2004 |
| KR | 101850086 | 1/2013 |
| KR | 1020170114602 | 10/2017 |

\* cited by examiner

SUCCESSIVE APPROXIMATION REGISTER ANALOG-TO-DIGITAL CONVERTER FOR WIDE SAMPLING RATE

CROSS-REFERENCE TO RELATED APPLICATION

The present application is a U.S. national phase application of PCT International Application PCT/KR2021/003393, which claims priority to Korean Patent Application No. 10-2020-0090579, filed Jul. 21, 2020, the entire contents of which are herein incorporated by reference.

TECHNICAL FIELD

The present disclosure relates to a successive approximation register analog-to-digital converter for a wide sampling rate and, more particularly, to an analog-to-digital converter capable of realizing a wide sampling rate by minimizing a leakage current generated in an analog switch.

BACKGROUND ART

The Internet of Things (IoT), which enables connection between various devices on the basis of information and communication technology, is in the spotlight. Accordingly, for the implementation of the IoT, technologies for rapidly processing and transmitting signals from various sensors have been introduced. In particular, a high-efficiency analog-to-digital converter (ADC) configured to quickly convert, with low power, analog signals generated from various sensors into digital signals is required.

In a process of converting an analog signal into a digital signal, the digital signal is output by sampling a temporally continuous analog signal. The sampling rate is defined as the number of sampling times of the analog signal per unit time, and the sampling rate may be different depending on system requirements. For example, the sampling rate may be 10 Ksps (10K samples per second) or 10 Msps.

In general, an analog-to-digital converter includes a capacitor array including capacitors and switches, and characteristics (for example, size) of a transistor implementing the switch vary for each sampling rate required for each system. Therefore, an analog-to-digital converter needs to be individually designed for each required sampling rate, which may lead to an increase in overall cost. Accordingly, an analog-to-digital converter having a wide range of sampling rates is required for design convenience and cost reduction.

DISCLOSURE

Technical Problem

Accordingly, the present disclosure has been made keeping in mind the above problems occurring in the related art, and an objective of the present disclosure is to provide a successive approximation register analog-to-digital converter to implement a wide sampling rate.

In addition, an embodiment of the present disclosure provides the successive approximation register analog-to-digital converter capable of realizing a wide sampling rate by minimizing leakage currents generated in analog switches.

Technical problems to be solved of the present disclosure invention are not limited to those mentioned above, and other problems not mentioned will be clearly understood by those skilled in the art from the description below.

Technical Solution

In order to accomplish the above objective, the present disclosure may provide an analog switch circuit in a successive approximation register analog-to-digital converter for a wide sampling rate, the analog switch circuit including: a first PMOS switch having one end connected to a capacitor and an opposite end connected to a first control node and controlled by a voltage of a second control node; a second PMOS switch having one end connected to the first control node and an opposite end connected to a reference voltage source configured to output a reference voltage and controlled by a control voltage; a first control switch unit configured to control a voltage of the first control node and the voltage of the second control node; a first NMOS switch having one end connected to the capacitor and an opposite end connected to a third control node and controlled by a voltage of a fourth control node; a second NMOS switch having one end connected to the third control node and an opposite end connected to a ground and controlled by the control voltage; and a second control switch unit configured to control a voltage of the third control node and the voltage of the fourth control node.

In an embodiment, when the second PMOS switch is in an on state, the first control switch unit may control such that the same voltage is applied to the first control node and the second control node, and when the second NMOS switch is in an on state, the second switch unit may control such that the same voltage is applied to the third control node and the fourth control node.

In the embodiment, the first control switch unit may include: a first control switch having one end connected to a node of the capacitor and an opposite end connected to the second control node; a second control switch having one end connected to the ground and an opposite end connected to the second control node; and a third control switch having one end connected to the second control node and an opposite end connected to the first control node, and the second control switch unit may include: a fourth control switch having one end connected to the node of the capacitor and an opposite end connected to the fourth control node; a fifth switch having one end connected to the reference voltage source and an opposite end connected to the fourth control node; and a sixth switch having one end connected to the fourth control node and an opposite end connected to the third control node.

In the embodiment, when the control voltage corresponds to the ground voltage, the first control switch, the third control switch, and the fifth control switch may be controlled in an off state, and the second control switch, the fourth control switch, and the sixth control switch may be controlled in an on state.

In the embodiment, when the control voltage corresponds to the reference voltage of the reference voltage source, the first control switch, the third control switch, and the fifth control switch may be controlled in an on state, and the second control switch, the fourth control switch, and the sixth control switch may be controlled in an off state.

A successive approximation register analog-to-digital converter for a wide sampling rate according to an embodiment of the present disclosure may include:
 a capacitor digital-to-analog converter comprising a capacitor array corresponding to output bits and an analog switch circuit; a comparator configured to output a high signal or a low signal by comparing output voltages of the capacitor digital-to-analog converter; and a digital controller configured to control the analog switch circuit at the capacitor digital-to-analog converter on the basis of the high signal or the low signal output from the comparator, wherein the analog switch circuit may include: a first PMOS switch having one end connected to a reference voltage source and an opposite end connected to a first control node and controlled by a control voltage; a second PMOS switch having one end connected to the first control node and an opposite end connected to a capacitor and controlled by a voltage of a second control node; a first control switch unit configured to control a voltage of the first control node and the voltage of the second control node; a first NMOS switch having one end connected to a ground and an opposite end connected to a third control node and controlled by the control voltage; a second NMOS switch having one end connected to the third control node and an opposite end connected to the capacitor and controlled by a voltage of a fourth control node; and a second control switch unit configured to control a voltage of the third control node and the voltage of the fourth control node.

Advantageous Effects

As described above, according to an embodiment of the present disclosure, a successive approximation register analog-to-digital converter can minimize leakage current and realize a wide sampling rate by controlling a voltage of each terminal of an analog switch connected to each of capacitors.

Effects of the present disclosure are not limited to those mentioned above, and other effects not mentioned will be clearly understood by those skilled in the art from the following description.

MODE FOR INVENTION

Figure 1:
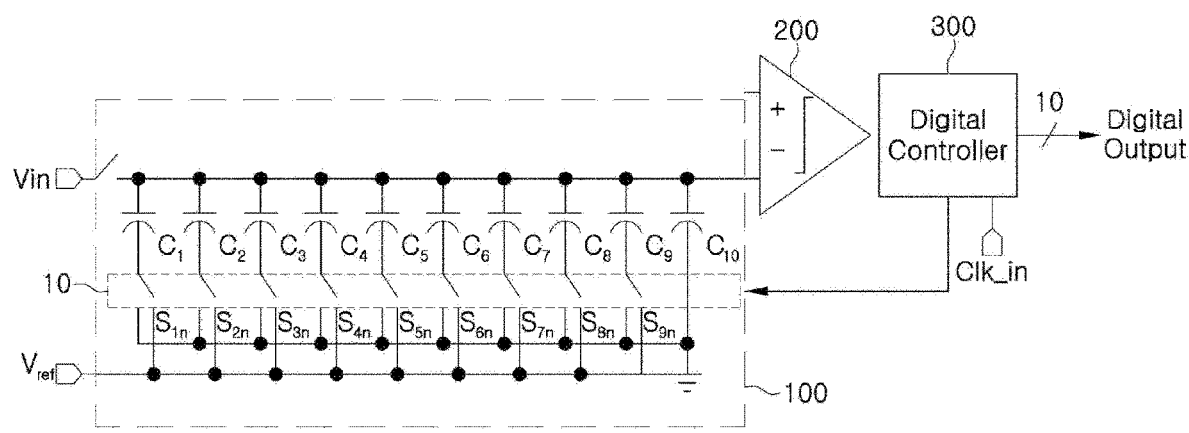
FIG. 1 is a structure diagram of a successive approximation register analog-to-digital converter.

Hereinafter, with reference to the accompanying drawings, embodiments of the present disclosure will be described in detail so that those of ordinary skill in the art to which the present disclosure pertains may easily implement the embodiments. The present disclosure may be embodied in many different forms and is not limited to the embodiments described herein.

In order to clearly describe the present disclosure, parts irrelevant to the description are omitted, and the same reference numerals are assigned to the same or similar elements throughout the specification.

In addition, in various embodiments, components having the same configuration will be described only in the representative embodiment using the same reference numerals, and in other embodiments, only configurations different from the representative embodiment will be described.

Throughout the specification, when it is said that a part is "connected (or coupled)" with another part, it includes not only a case in which the parts are "directly connected (or coupled)" with each other but also a case in which the parts are "indirectly connected (or coupled)" with each other with another member interposed therebetween. In addition, when it is said that a part "includes" a certain component, this means that the part may further include other components rather than exclude other components unless otherwise stated.

Unless defined otherwise, all terms, including technical or scientific terms, used herein have the same meaning as commonly understood by one of ordinary skill in the art to which this invention pertains. Terms such as those defined in a commonly used dictionary should be interpreted as having a meaning consistent with the meaning in the context of the related art and should not be interpreted in an ideal or excessively formal meaning unless explicitly defined in the present application.

FIG. 1 is a structure diagram of a successive approximation register (SAR) analog-to-digital converter. The successive approximation register (SAR) analog-to-digital converter largely includes a capacitor digital-to-analog converter (C-DAC) 100, a comparator 200, and a digital controller 300.

The C-DAC 100 samples input analog voltage Vin and, on the basis of control signals provided from the digital controller 300, may output a first level voltage $V_+$ and a second level voltage $V_-$ to an inverting terminal (−) and a non-inverting terminal (+) of the comparator 200, respectively. The C-DAC 100 may include capacitors having different capacitances and an analog switch circuit 10 including analog switches.

The comparator 200 compares the output voltages (the first level voltage V+ and the second level voltage V−) output from the C-DAC 100, thereby outputting a comparison signal having a high level or a low level. The digital controller 300 may output the control signals for controlling each analog switch of the analog switch circuit 10 of the C-DAC using the comparison signal output from the comparator 200. The control signals of the digital controller 300 are control signals for controlling on-off of a switch connected to each capacitor. The C-DAC may be configured as an array (capacitor array) of a capacitor-analog unit consisting of capacitors and the analog switch circuit 10, and the capacitor array may be connected to the inverting terminal (−) and the non-inverting terminal (+) of the comparator 200, respectively. In FIG. 1, the C-DAC 100 configured with the capacitor array connected to the inverting terminal (−) of the comparator 200 is only shown, but a C-DAC 100 configured with the same type of capacitor array connected to the non-inverting terminal (+) of the comparator 200 may also be present.

In the capacitor array of the C-DAC 100, each capacitor corresponds to each bit of a digital signal output from the analog-to-digital converter. In FIG. 1, each capacitor may correspond to each bit of a 10-bit digital signal, for example, when the capacitor corresponding to the most significant bit is C10 and the capacitor corresponding to the next most significant bit is C9, then C9=½*C10. That is, in the capacitor array of the C-DAC 100, a capacitor having a capacitance corresponding to a multiple of 2 with respect to the capacitance of an adjacent capacitor may be arranged.

In the successive approximation register analog-to-digital converter, in a state in which an input analog signal is temporarily stored in the C-DAC 100, a digital output is generated. However, in a state in which an input analog signal is temporarily stored in the C-DAC 100, a digital output is generated. On the other hand, the analog signal stored in the C-DAC 100 may be lost due to a leakage current of the analog switch and thus the digital output signal may also be damaged.

In addition, when the time for storing and processing the analog signal in the C-DAC 100 increases, a lot of damage to the analog signal may occur as proportionately as the time. That is, when the specification of the analog-to-digital converter is 10 Msps (10M samples per second), the time for generating a digital signal of one sample is 0.1 µs. That is, when the analog signal is processed in a state of being stored in the capacitor of the C-DAC 100 for 0.1 µs, the leakage current escapes for 0.1 µs.

When the specification of the analog-to-digital converter is 10 Ksps, the time for generating a digital signal of one sample is 0.1 ms. In this case, the amount of leakage current of the analog signal stored in the capacitor of the C-DAC 100 for 0.1 ms is also 1000 times compared to that in the analog-to-digital converter with a sampling rate of 10 Msps. Therefore, the analog-digital converter designed with the 10 Msps specification may not be used with the 10 Ksps specification, and a new analog-to-digital converter design is required.

However, when there is no or very little leakage current of the analog signal stored in the C-DAC 100, not only a digital signal with an accurate value may be output, but also when the analog-to-digital converter designed for 10 Msps is even used by being converted to 10 Ksps, deterioration in properties may not be caused. In other words, when the leakage current generated from the analog switch is removed, it will be possible to realize a wide sampling rate.

Figure 2:
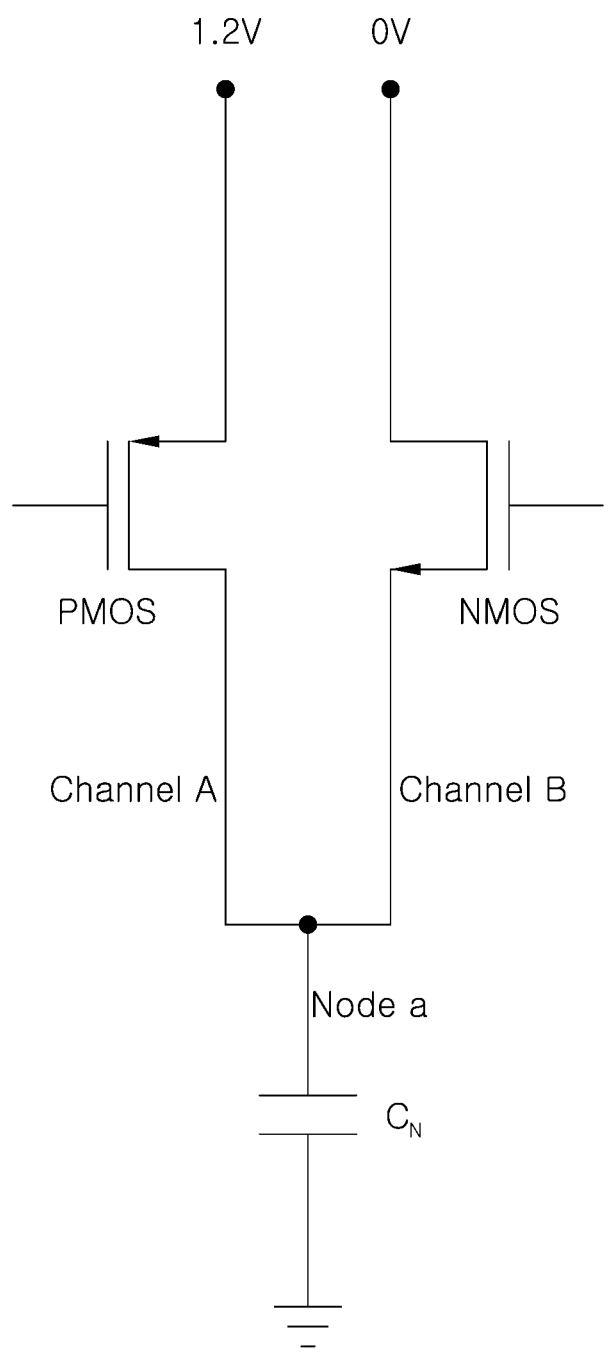
FIG. 2 is a circuit diagram of an analog switch of a conventional capacitor digital-to-analog converter.
Figure 3:
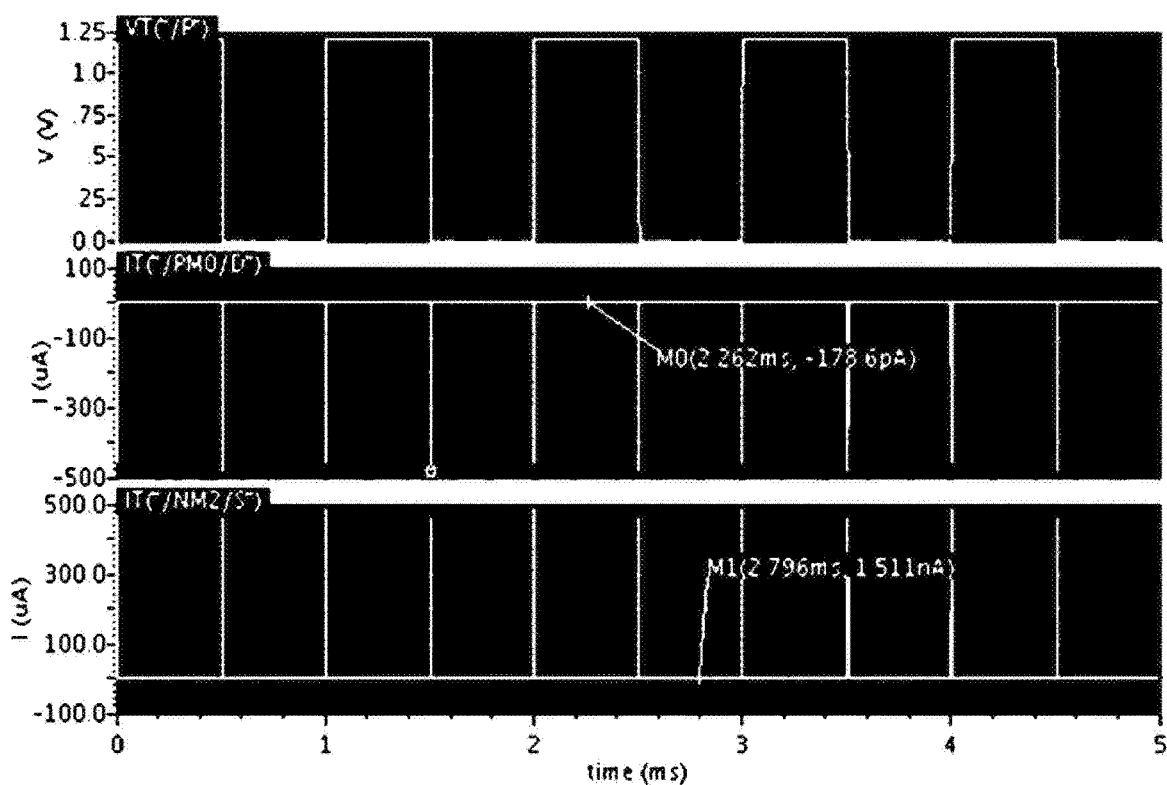
FIG. 3 is a diagram illustrating simulation results for leakage currents generated in the analog switch of the conventional capacitor digital-to-analog converter.

FIG. 2 is a circuit diagram of an analog switch of a conventional capacitor digital-to-analog converter, and FIG. 3 is a diagram illustrating simulation results for leakage currents generated in the analog switch of the conventional capacitor digital-to-analog converter. In the analog switch circuit of FIG. 2, when 0V is applied to a port P and a port N, a channel A is connected and a channel B is disconnected. At this time, 1.2V is applied to a source terminal of an NMOS of the channel B and 0V is applied to a gate terminal, so that a reverse voltage of 1.2V is applied to a PN junction, and at this time, a leakage current may occur. Looking at the simulation results for the circuit of FIG. 2, it may be confirmed that the leakage current of the NMOS is 1.511 nA as shown in FIG. 3.

Conversely, when 1.2V is applied to the port P and 1.2V is applied to the port N, the channel A is disconnected and the channel B is connected, and 0V is applied to a node-a. In addition, 0V and 1.2V are applied to a drain terminal and a gate terminal of a PMOS of the channel A, respectively. At this time, a reverse voltage of 1.2V may be applied to a PN junction of the PMOS, whereby leakage current may be generated. Looking at the simulation result of FIG. 3, a leakage current of 178.6 pA occurs. Accordingly, the analog signal stored in the capacitor may be damaged, and the output digital signal may also be damaged.

Thus, the embodiment of the present disclosure may implement the successive approximation register analog-to-digital converter with better characteristics by minimizing the current generated in the analog switches of the C-DAC 100 and thus may operate in a wide range of sampling rates.

Figure 4:
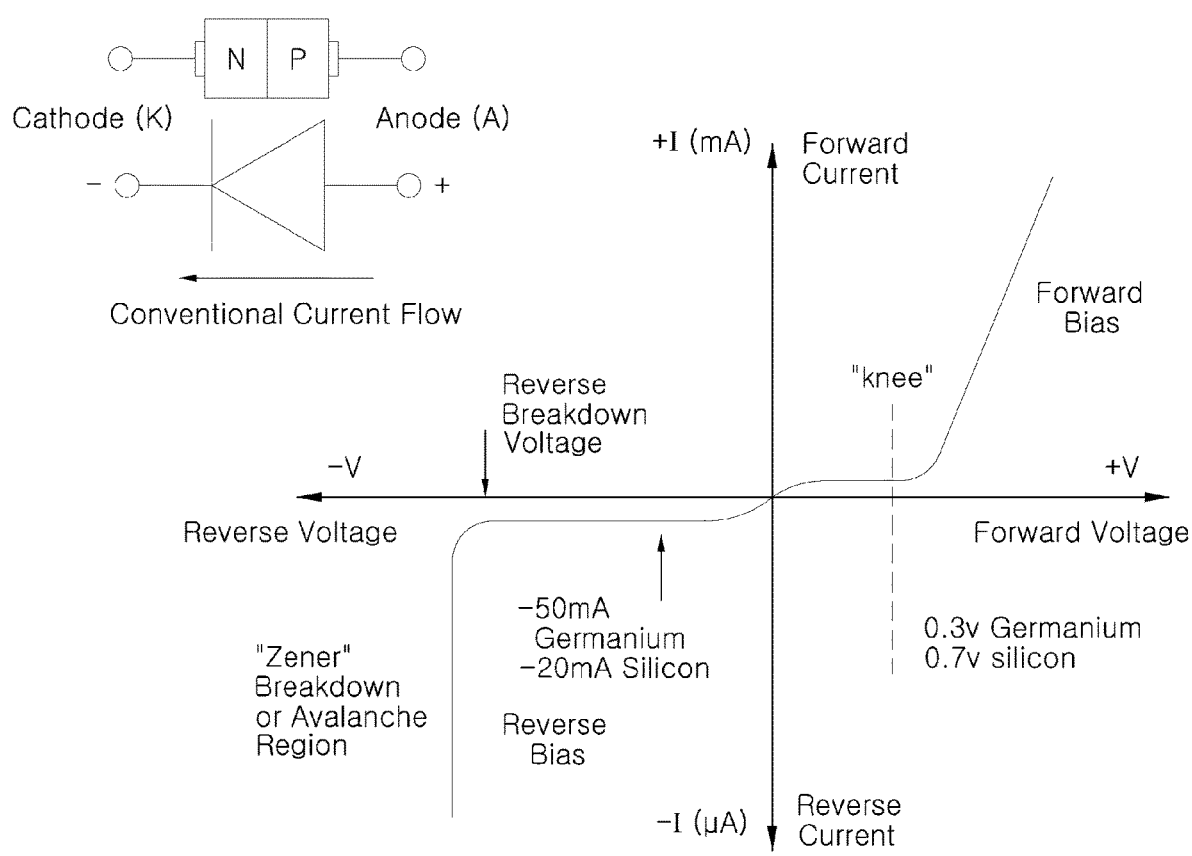
FIGS. 4 and 5 are diagrams for explaining a phenomenon in which a leakage current occurs in a PN junction.
Figure 5:
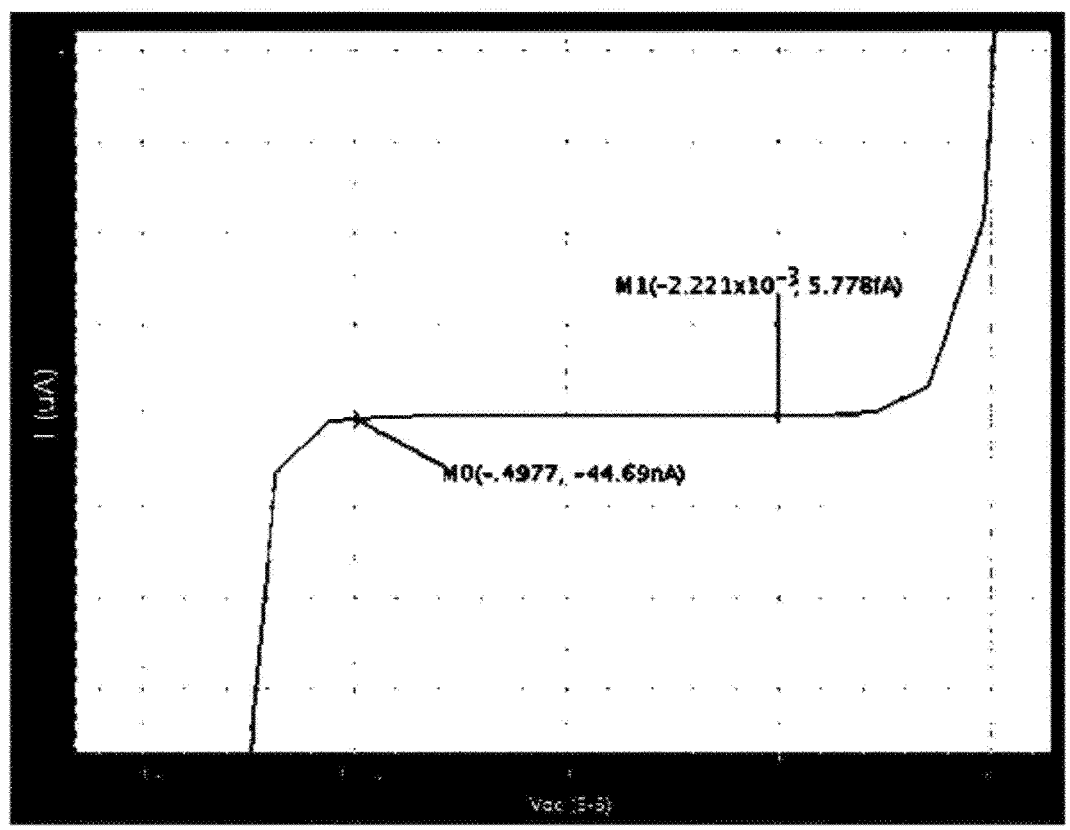

FIGS. 4 and 5 are diagrams for explaining a phenomenon in which a leakage current occurs in a PN junction. FIG. 4 is a graph of a current change according to a voltage applied to a P-type region (P-terminal) and an N-type region (N-terminal) of the PN junction. For example, when a reverse bias is applied, such as when voltages of 0V and 1.2V are applied to the P terminal and the N terminal, respectively, a leakage current may occur from the N terminal to the P terminal. In the graph of FIG. 4, the third quadrant corresponds to a region where the leakage current is generated when the reverse bias is applied.

FIG. 5 is a simulation result of leakage current generated when a reverse voltage is applied to a general MOSFET. With reference to FIG. 5, when a reverse voltage of 0.5V is applied to the PN junction, a large amount (44.69 nA) of leakage current occurs, and when the voltages at the P and N terminals are 0V, that is, when the same voltage is applied to the P and N terminals, it is confirmed that a very small amount of a leakage current of 5.778 fA occurs.

Thus, in order to equalize the voltages of the P terminal and the N terminal so as to remove the leakage current when the analog switch is in the off state in the analog switch circuit of the C-DAC 100, the embodiment of the present disclosure provides a method of controlling the voltages applied to the source terminal, the gate terminal, and the drain terminal, respectively, to become equal.

Figure 6:
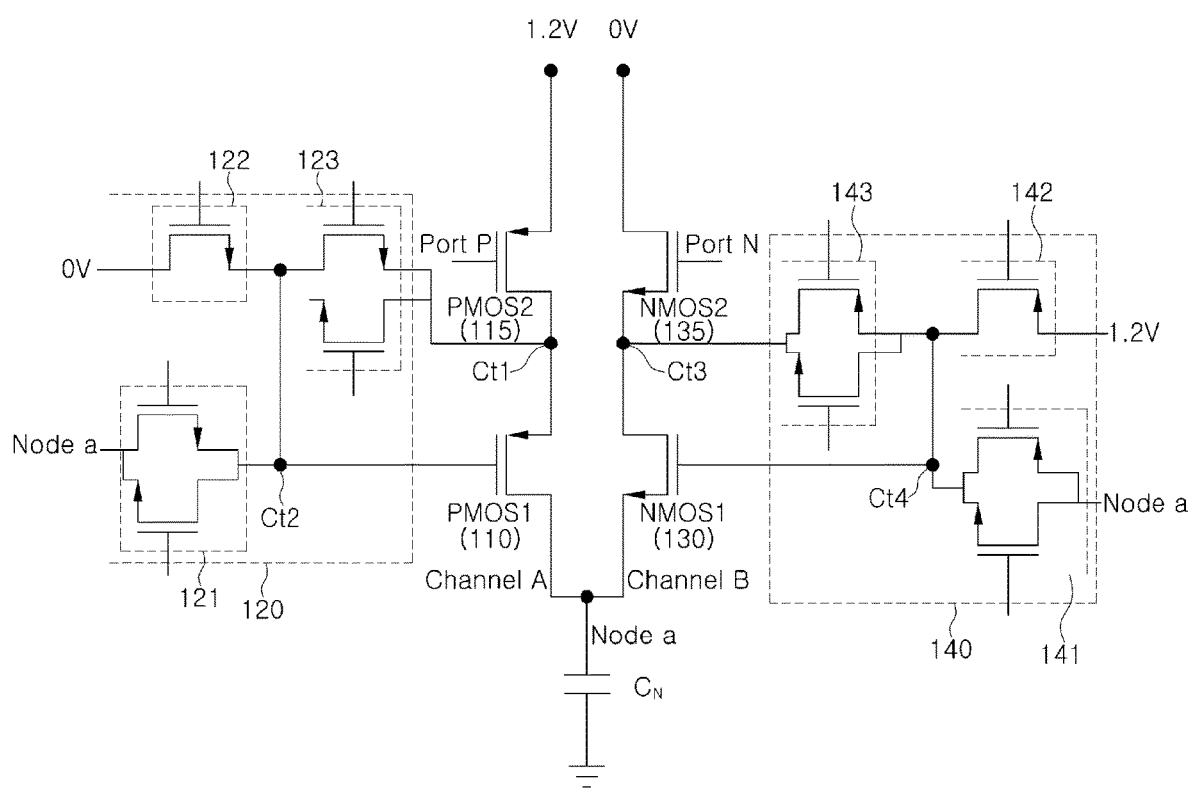
FIG. 6 shows an example of an analog switch circuit diagram in a successive approximation register analog-to-digital converter for a wide sampling rate according to an embodiment of the present disclosure.

FIG. 6 shows an example of an analog switch circuit diagram in a successive approximation register analog-to-digital converter for a wide sampling rate according to an embodiment of the present disclosure. In the circuit of FIG. 6, the switches 110, 115, 130, and 135, configured to selectively connect the channel A or channel B, are applied, in an off state, with voltages through the source, gate, and drain thereof, respectively, and the control switches 121, 122, 123, 141, 142, and 143 are provided to control the voltages above to become equal. FIG. 6 illustrates a case in which 1.2V is applied as the power supply voltage, but it is natural that the applied DC voltage may be changed for each device that is applied with the DC voltage.

With reference to FIG. 6, an analog switch circuit in the successive approximation register analog-to-digital converter for a wide sampling rate according to the embodiment of the present disclosure includes: a first PMOS switch 110 having one end (source terminal) connected to a capacitor CN (node-a) and an opposite end (drain terminal) connected to a first control node Ct1 and controlled by the voltage of a second control node Ct2; a second PMOS switch 115 having one end (source terminal) connected to the first control node Ct1 and an opposite end (drain terminal) connected to a reference voltage source configured to output a reference voltage 1.2V; a first control switch unit 120 configured to control a voltage of the first control node Ct1 and the voltage of the second control node Ct2; a first NMOS switch 130 having one end (source terminal) connected to the capacitor CN (node-a) and an opposite end (drain terminal) connected to a third control node Ct3 and controlled by a voltage of a fourth control node Ct4; a second NMOS switch 135 having one end (source end) connected to the third control node Ct3 and an opposite end connected to the ground; and a second control switch unit 140 configured to control a voltage of the third control node Ct3 and the voltage of the fourth control node Ct4.

W5 Here, control signals for controlling the switches of FIG. 6 may be output by the digital controller 300.

TABLE 1

| Switch | Channel A connected/ Channel B disconnected | Channel A disconnected/ Channel B connected |
|---|---|---|
| Port P | 0 V | 1.2 V (Power supply voltage) |
| Port N | 0 V | 1.2 V (Power supply voltage) |
| Control switch 1 | off | on |
| Control switch 2 | on | off |
| Control switch 3 | off | on |
| Control switch 4 | on | off |
| Control switch 5 | off | on |
| Control switch 6 | on | off |

In the circuit of FIG. 6, when 0V is applied to the port P, and 0V is also applied to the port N, the channel A is connected, the channel B is disconnected, and 1.2V is applied to the node-a. At this time, the second control switch 122 is turned on to activate the channel A, and the fourth control switch 141 and the sixth control switch 143 are connected to each other, whereby the same voltage as the node-a is applied to all of the source, the gate, and the drain of the first NMOS switch 130 in the channel B. Thus, the voltages of the NPN (that is, the P and N terminals of the PN junction) of the first NMOS switch 130 in the channel B become the same so that, in theory, no leakage current occurs.

Conversely, when 1.2V is applied to the port P and 1.2V is applied to the port N, the channel A is disconnected, and the channel B is connected. At this time, 0V is applied to the node-a, the fifth control switch 142 is turned on, and the first control switch 121 and the third control switch 123 are turned on, so that the voltages of the PNPs (that is, the P and N terminals of the PN junction) of the first PMOS switch 110 in the channel A become the same so that, in theory, no leakage current occurs.

In the embodiment of the present disclosure, when the second PMOS switch 115 is in the on state (when the channel A is connected), the first control switch unit 120 may control such that the same voltage is applied to the first control node Ct1 and the second control node Ct2, and when the second NMOS switch 135 is in the on state (when the channel B is connected), the second control switch unit 140 may control such that the same voltage is applied to the third control node Ct3 and the fourth control node Ct4.

In the embodiment of the present disclosure, the first control switch unit 120 may include: a first control switch 121 having one end connected to the capacitor node (node-a) and an opposite end connected to the second control node Ct2; a second control switch 122 having one end connected to the ground 0V and an opposite end connected to the second control node Ct2; and a third control switch 123 having one end connected to the second control node Ct2 and an opposite end connected to the first control node Ct1. In addition, the second control switch unit 140 may include: a fourth control switch 141 having one end connected to the capacitor node (node-a) and an opposite end connected to the fourth control node Ct4; a fifth control switch 142 having one end connected to the reference voltage source 1.2V and an opposite end connected to the fourth control node Ct4; and a sixth control switch 143 having one end connected to the fourth control node Ct4 and an opposite end connected to the third control node Ct3.

In the embodiment of the present disclosure, when the control voltages (the voltages of the port P and the port N) correspond to the ground voltage 0V, the first control switch 121, the third control switch 123, and the fifth control switch 142 operates in an off state, and the second control switch 122, the fourth control switch 141, and the sixth control switch 143 may be controlled in an on state.

In addition, when the control voltages (the voltages of the port P and the port N) correspond to the reference voltage 1.2V of the reference voltage source, the first control switch 121, the third control switch 123, and the fifth control switch 142 may be controlled in an on state, and the second control switch 122, the fourth control switch 141, and the sixth control switch 143 may be controlled in an off state.

Figure 7:
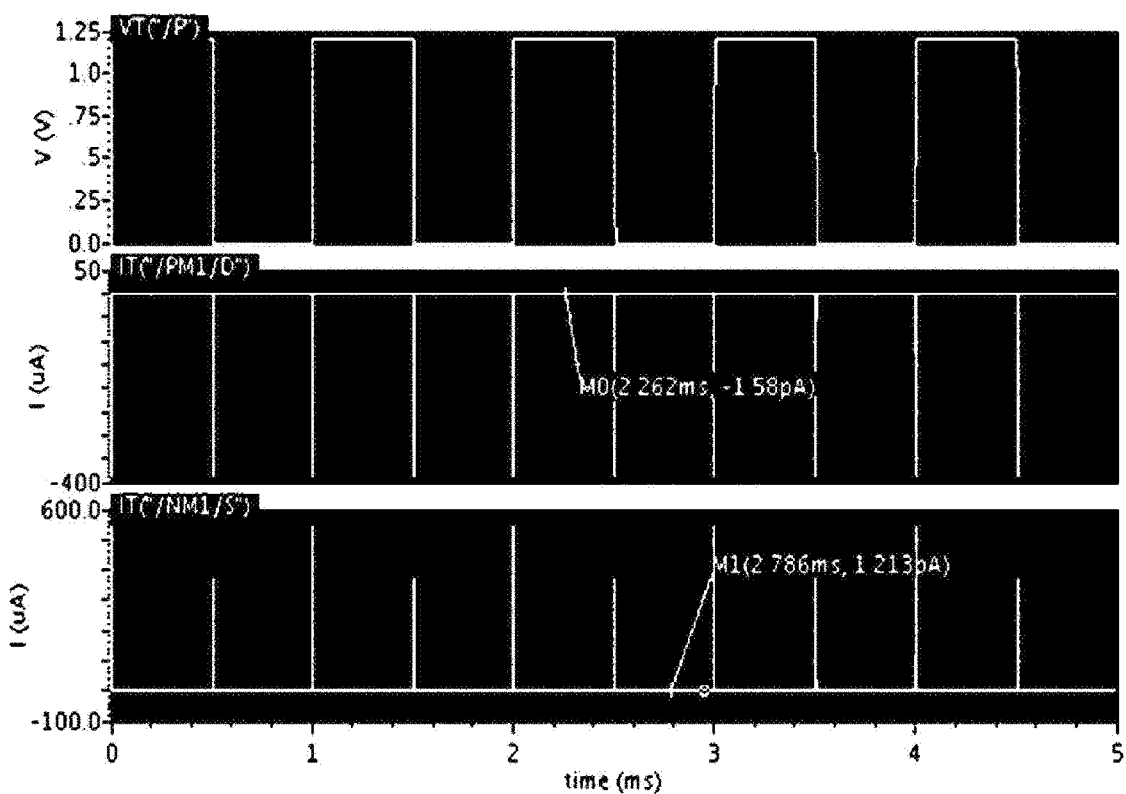
FIG. 7 is a diagram illustrating simulation results for leakage currents generated in the analog switch of the successive approximation register analog-to-digital converter for a wide sampling rate according to an embodiment of the present disclosure.

FIG. 7 is a diagram illustrating simulation results for leakage currents generated in the analog switch of the successive approximation register analog-to-digital converter for a wide sampling rate according to an embodiment of the present disclosure. As a simulation result for the circuit of FIG. 6, it is confirmed that a very small leakage current occurs, and as shown in Table 2, the leakage current is reduced by 113 times in the PMOS and 1245 times in the NMOS compared to those in the conventional analog switch circuit.

TABLE 2

|  | Leakage current in conventional circuit | Leakage current in present disclosure circuit | Comparison of leakage current(conventional circuit/Present disclosure circuit) (times) |
|---|---|---|---|
| PMOS | 178.6 pA | 1.58 pA | 178.6/1.58 = 113 |
| NMOS | 1.511 nA | 1.213 pA | 1511/1.213 = 1245 |

Therefore, the successive approximation register analog-to-digital converter designed with a specification of 10 Msps may operate at a wide sampling rate from 100 times to 1245 times, that is, from 100 Ksps to 10 Ksps.

Figure 8:
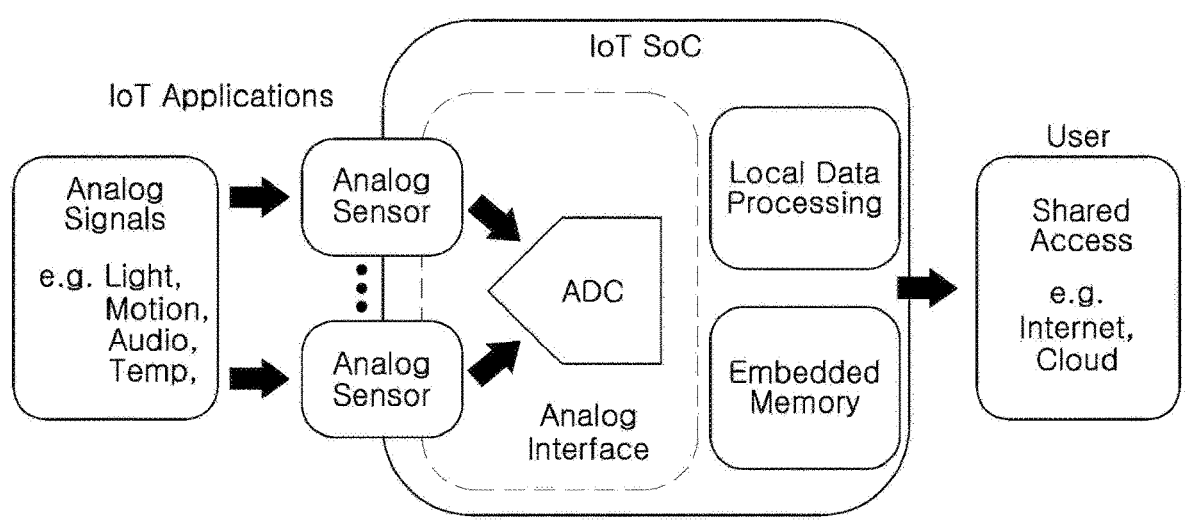
FIG. 8 is a diagram illustrating a field to which the analog-to-digital converter according to the embodiment of the present disclosure may be applied.

FIG. 8 is a diagram illustrating a field to which the analog-to-digital converter according to the embodiment of the present disclosure may be applied.

As described above, not only the analog-to-digital converter, to which the analog switches that minimize the leakage currents of the C-DAC 100 for the wide sampling rate are applied, has improved characteristics thereof but also one type of the analog-to-digital converter may be applied to several types of the IoT sensors. That is, the same analog-to-digital converter may be applied to IoT sensors having various sampling rates.

In particular, a wide sampling rate characteristic of the analog-to-digital converter according to the present disclosure converts detected analog signals such as light, sound, voice, temperature, and the like into digital signals, is stored in a memory through a processing block in a system, and may provide data in a form that may be accessed and used by a user. For example, the analog-to-digital converter according to the embodiment of the present disclosure may be applied to all of the types of sensors shown as in Table 3 below.

TABLE 3

| No. | IoT sensor application ADC |
|---|---|
| 1 | Image sensor ADC (image, infrared) |
| 2 | Gas sensor ADC |
| 3 | Temperature sensor ADC |
| 4 | Pressure sensor ADC |
| 5 | Bio sensor ADC |
| 6 | Flow sensor ADC |
| 7 | Motion sensor ADC |
| 8 | Dust sensor ADC |
| 9 | Light sensor ADC |
| 10 | Fingerprint sensor ADC |
| 11 | Sound sensor ADC |
| 12 | Radar sensor ADC |
| 13 | Touch sensor ADC |
| 14 | Radiation sensor ADC |
| 15 | Water quality sensor ADC |
| 16 | Ultrasonic sensor ADC |
| 17 | Magnetic sensor ADC |
| 18 | Other sensor ADC (load/force/torque/level/position/ROIC) |

The present embodiment and the drawings attached to the present specification are only clearly showing some of the technical ideas included in the present disclosure. In addition, it will be apparent that all possible modifications and specific embodiments, which those skilled in the art may easily infer within the scope of the technical ideas included in the specification and drawings of the present disclosure, are included in the scope of the present disclosure.

Therefore, the spirit of the present disclosure should not be limited to the described embodiments and not only the claims to be described later but also all those equivalent or modified to be equivalent to the claims will be regarded to belong to the scope of the spirit of the present disclosure.

The invention claimed is:

1. An analog switch circuit in a successive approximation register analog-to-digital converter for a wide sampling rate, the analog switch circuit comprising:
   a first PMOS switch having one end connected to a capacitor and an opposite end connected to a first control node and controlled by a voltage of a second control node;
   a second PMOS switch having one end connected to the first control node and an opposite end connected to a reference voltage source configured to output a reference voltage and controlled by a control voltage;
   a first control switch unit configured to control a voltage of the first control node and the voltage of the second control node;
   a first NMOS switch having one end connected to the capacitor and an opposite end connected to a third control node and controlled by a voltage of a fourth control node;
   a second NMOS switch having one end connected to the third control node and an opposite end connected to a ground and controlled by the control voltage; and
   a second control switch unit configured to control a voltage of the third control node and the voltage of the fourth control node.

2. The analog switch circuit of claim 1, wherein, when the second PMOS switch is in an on state, the first control switch unit controls such that the same voltage is applied to the first control node and the second control node, and when the second NMOS switch is in an on state, the second control switch unit controls such that the same voltage is applied to the third control node and the fourth control node.

3. The analog switch circuit of claim 1, wherein the first control switch unit comprises:
   a first control switch having one end connected to a node of the capacitor and an opposite end connected to the second control node;
   a second control switch having one end connected to the ground and an opposite end connected to the second control node; and
   a third control switch having one end connected to the second control node and an opposite end connected to the first control node, and
   the second control switch unit comprises:
   a fourth control switch having one end connected to the node of the capacitor and an opposite end connected to the fourth control node;
   a fifth control switch having one end connected to the reference voltage source and an opposite end connected to the fourth control node; and
   a sixth control switch having one end connected to the fourth control node and an opposite end connected to the third control node.

4. The analog switch circuit of claim 3, wherein, when the control voltage corresponds to a ground voltage, the first control switch, the third control switch, and the fifth control switch are controlled in an off state, and
   the second control switch, the fourth control switch, and the sixth control switch are controlled in an on state.

5. The analog switch circuit of claim 3, wherein, when the control voltage corresponds to the reference voltage of the reference voltage source, the first control switch, the third control switch, and the fifth control switch are controlled in an on state, and
   the second control switch, the fourth control switch, and the sixth control switch are controlled in an off state.

6. A successive approximation register analog-to-digital converter for a wide sampling rate, the analog-to-digital converter comprising:
   a capacitor digital-to-analog converter comprising a capacitor array corresponding to output bits and an analog switch circuit;
   a comparator configured to output a high signal or a low signal by comparing output voltages of the capacitor digital-to-analog converter; and
   a digital controller configured to control the analog switch circuit at the capacitor digital-to-analog converter on the basis of the high signal or the low signal received from the comparator,
   wherein the analog switch circuit comprises:
   a first PMOS switch having one end connected to a reference voltage source and an opposite end connected to a first control node and controlled by a control voltage;
   a second PMOS switch having one end connected to the first control node and an opposite end connected to a capacitor and controlled by a voltage of a second control node;
   a first control switch unit configured to control a voltage of the first control node and the voltage of the second control node;
   a first NMOS switch having one end connected to a ground and an opposite end connected to a third control node and controlled by the control voltage;

a second NMOS switch having one end connected to the third control node and an opposite end connected to the capacitor and controlled by a voltage of a fourth control node; and a second control switch unit configured to control a voltage of the third control node and the voltage of the fourth control node.

7. The analog-to-digital converter of claim 6, wherein the first control switch unit controls such that the same voltage is applied to the first control node and the second control node, and the second control switch unit controls such that the same voltage is applied to the third control node and the fourth control node.

8. The analog-to-digital converter of claim 6, wherein the first control switch unit comprises:

a first control switch having one end connected to the capacitor and an opposite end connected to the second control node;

a second control switch having one end connected to the ground and an opposite end connected to the second control node; and a third control switch having one end connected to the second control node and an opposite end connected to the first control node, and the second control switch unit comprises:

a fourth control switch having one end connected to the capacitor and an opposite end connected to the fourth control node;

a fifth control switch having one end connected to the reference voltage source and an opposite end connected to the fourth control node; and a sixth control switch having one end connected to the fourth control node and an opposite end connected to the third control node.

9. The analog-to-digital converter of claim 8, wherein, when the control voltage corresponds to a ground voltage, the first control switch, the third control switch, and the fifth control switch are controlled in an off state, and the second control switch, the fourth control switch, and the sixth control switch are controlled in an on state.

10. The analog-to-digital converter of claim 8, wherein, when the control voltage corresponds to a reference voltage of the reference voltage source, the first control switch, the third control switch, and the fifth control switch are controlled in an on state, and the second control switch, the fourth control switch, and the sixth control switch 143 may be controlled in an off state.

* * * * *